US011935227B2

(12) United States Patent
Nomura et al.

(10) Patent No.: US 11,935,227 B2
(45) Date of Patent: Mar. 19, 2024

(54) NOTCH DETECTING METHOD

(71) Applicant: DISCO CORPORATION, Tokyo (JP)

(72) Inventors: Yasukuni Nomura, Tokyo (JP); Shinji Yoshida, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 416 days.

(21) Appl. No.: 17/449,834

(22) Filed: Oct. 4, 2021

(65) Prior Publication Data
US 2022/0138922 A1 May 5, 2022

(30) Foreign Application Priority Data
Oct. 30, 2020 (JP) .................................. 2020-182001

(51) Int. Cl.
G06T 7/13 (2017.01)
G01B 11/24 (2006.01)
G06T 7/00 (2017.01)

(52) U.S. Cl.
CPC .............. *G06T 7/001* (2013.01); *G01B 11/24* (2013.01); *G06T 7/13* (2017.01); *G06T 2207/20021* (2013.01); *G06T 2207/30148* (2013.01)

(58) Field of Classification Search
CPC . G06T 7/001; G06T 7/13; G06T 2207/20021; G06T 2207/30148; G06T 7/73; G01B 11/24; H01L 21/683; H01L 21/6838; H01L 21/68714; H01L 21/68785; H01L 21/68792; H01L 21/68; H01L 22/12; H01L 22/26; H01L 21/67259; H01L 23/544; H01L 2223/54493
USPC ........................................................ 382/149
See application file for complete search history.

(56) References Cited

U.S. PATENT DOCUMENTS

| | | | | |
|---|---|---|---|---|
| 4,887,904 A | * | 12/1989 | Nakazato ............. | H01L 21/681 414/757 |
| 5,028,200 A | * | 7/1991 | Shimane .................. | H01L 21/68 414/757 |
| 5,308,222 A | * | 5/1994 | Bacchi .................... | B65G 47/24 414/816 |
| 5,438,209 A | * | 8/1995 | Yamamoto ............ | H01L 21/681 250/548 |

(Continued)

FOREIGN PATENT DOCUMENTS

| | | | | |
|---|---|---|---|---|
| JP | 2011040637 A | | 2/2011 | |
| KR | 20070058354 A | * | 6/2007 | ............. H01L 21/68 |

OTHER PUBLICATIONS

Search report issued in counterpart Singapore patent application No. 10202111055P, dated Aug. 28, 2023.

*Primary Examiner* — Roy M Punnoose
(74) *Attorney, Agent, or Firm* — Greer Burns & Crain Ltd.

(57) ABSTRACT

A notch detecting method for detecting a notch defined in an outer circumferential portion of a wafer includes a placing step of placing the wafer on a rotary table, an image capturing step of acquiring an image of the outer circumferential portion of the wafer, a contour data acquiring step of acquiring contour data including coordinates of a contour of the wafer, a hypothetical circle calculating step of calculating a hypothetical circle that approximates the contour of the wafer, an irregularly shaped area determining step of determining whether an irregularly shaped area exists in the outer circumferential portion of the wafer or not, and a first notch determining step of determining whether the irregularly shaped area is the notch or not.

3 Claims, 9 Drawing Sheets

(56) References Cited

U.S. PATENT DOCUMENTS

| | | | | |
|---|---|---|---|---|
| 5,511,934 A | * | 4/1996 | Bacchi | H01L 21/681 |
| | | | | 414/936 |
| 5,513,948 A | * | 5/1996 | Bacchi | H01L 21/681 |
| | | | | 414/936 |
| 5,851,102 A | * | 12/1998 | Okawa | H01L 21/682 |
| | | | | 414/936 |
| 6,677,602 B1 | * | 1/2004 | Norton | H01L 21/681 |
| | | | | 250/559.3 |
| 2008/0068618 A1 | | 3/2008 | Kagami | |
| 2009/0316980 A1 | * | 12/2009 | Hanada | H01L 21/67207 |
| | | | | 382/149 |

* cited by examiner

NOTCH DETECTING METHOD

BACKGROUND OF THE INVENTION

Field of the Invention

The present invention relates to a notch detecting method for detecting a notch representing a crystal orientation of a wafer.

Description of the Related Art

Device chip manufacturing processes produce device chips by processing wafers where devices are formed in respective areas demarcated on the wafers by a grid of streets, also known as projected dicing lines, established on face sides of the wafers. The wafers are divided along the streets into a plurality of device chips having the respective devices. The device chips thus fabricated will be used in various electronic appliances including mobile phones, personal computers, etc.

A wafer is divided by a cutting apparatus, for example. The cutting apparatus divides the wafer, i.e., a workpiece, by causing a rotating annular cutting blade to cut into the wafer. A wafer may alternatively be divided by a laser processing apparatus that includes a laser beam applying unit for applying a laser beam to the wafer, i.e., a workpiece. In recent years, as electronic appliances have become smaller in size, the device chips have been required to be thinner. To meet such a requirement, therefore, it has been customary to thin a wafer before the wafer is divided into individual device chips. Wafers are typically thinned by a grinding apparatus that grinds a workpiece with a grinding wheel having a plurality of grindstones. The wafers thus thinned are divided along the streets thereon into thin device chips.

Crystalline wafers such as silicon wafers each have an indentation referred to as a notch that represents their crystal orientation. The notch is formed by intentionally cutting a fragment off from the outer circumferential portion of a wafer. When such a notched crystalline wafer is processed by various processing apparatus described above, the notch of the wafer is detected and its orientation is adjusted on the basis of the position of the detected notch. In this manner, it is possible to process the wafer with the notch directed in a predetermined orientation. JP 2011-40637A, for example, discloses a grinding apparatus including positioning means for positioning a wafer. The disclosed positioning means detects a notch defined in the outer circumferential portion of a wafer from an image captured of the wafer by a camera, and adjusts the central position and orientation of the wafer on the basis of the detected notch.

SUMMARY OF THE INVENTION

When a crystalline wafer is processed by a processing apparatus, the processability of the wafer may be different depending on the crystal orientation of the wafer due to the processing details. For this reason, the processing apparatus detects a notch of the wafer and processes the wafer as it is directed in a predetermined orientation based on the position of the detected notch.

However, the outer circumferential portion of a notched wafer may have an indentation other than the notch. For example, when such a notched wafer is machined in a cutting process, a grinding process, or the like, if the machining tool contacts the wafer, it may chip a fragment off from the outer circumferential portion of the wafer, forming an unintentional indentation therein that appears to be similar to the notch. In the presence of the indentation, a subsequent process of detecting the notch of the wafer may tend to fail to identify the notch or the indentation correctly, i.e., may determine the accidentally formed indentation as the notch in error. If the unintentional indentation formed in the outer circumferential portion of the wafer is erroneously determined as the notch, then the processing apparatus positions the wafer on the basis of the indentation erroneously identified as the notch, and then processes the wafer. As a result, the wafer is processed while being directed in a wrong orientation, and is liable to suffer a processing failure.

In view of the above problems, it is an object of the present invention to provide a method of correctly detecting a notch of a wafer.

In accordance with an aspect of the present invention, there is provided a notch detecting method for detecting a notch defined in an outer circumferential portion of a disk-shaped wafer as representing a crystal orientation of the wafer, including a placing step of placing the wafer on a rotary table and positioning a portion of the outer circumferential portion of the wafer in an image capturing area of a camera, an image capturing step of capturing a plurality of images of the wafer with the camera while the rotary table is rotating, thereby acquiring an image of the outer circumferential portion of the wafer, a contour data acquiring step of acquiring contour data including coordinates of a contour of the wafer on the basis of the acquired image, a hypothetical circle calculating step of calculating a hypothetical circle that approximates the contour of the wafer on the basis of the coordinates of the contour of the wafer, an irregularly shaped area determining step of determining whether an irregularly shaped area exists in the outer circumferential portion of the wafer or not on the basis of a distance between the hypothetical circle and the contour of the wafer along radial directions of the wafer, and a first notch determining step of determining whether the irregularly shaped area is the notch or not on the basis of a distance between the hypothetical circle and a tip end of the irregularly shaped area along the radial directions of the wafer.

Preferably, the notch detecting method further includes a pointedness calculating step for calculating pointedness of the irregularly shaped area and a second notch determining step of determining whether the irregularly shaped area is a notch or not on the basis of the pointedness of the irregularly shaped area.

Preferably, the notch detecting method further includes a dividing step of dividing the image into a first image and a second image by a straight line that extends radially of the wafer to divide the irregularly shaped area into two parts, a first similarity calculating step of calculating a first similarity corresponding to a similarity between the first image and an inverted image produced by inverting the second image about the straight line, a second similarity calculating step of calculating a second similarity corresponding to a similarity between the first image and the second image, a third notch determining step of determining whether the irregularly shaped area is a notch or not on the basis of the first similarity, and a fourth notch determining step of determining whether the irregularly shaped area is a notch or not on the basis of the second similarity.

The notch detecting method for detecting a notch according to an aspect of the present invention determines whether an irregularly shaped area formed in the outer circumferential portion of the wafer is the notch or not on the basis of the size or shape of the irregularly shaped area. Accordingly, even if an indentation other than the notch is formed in the outer circumferential portion of the wafer, the indentation is less likely to be erroneously determined as the notch, and the notch can properly be detected.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
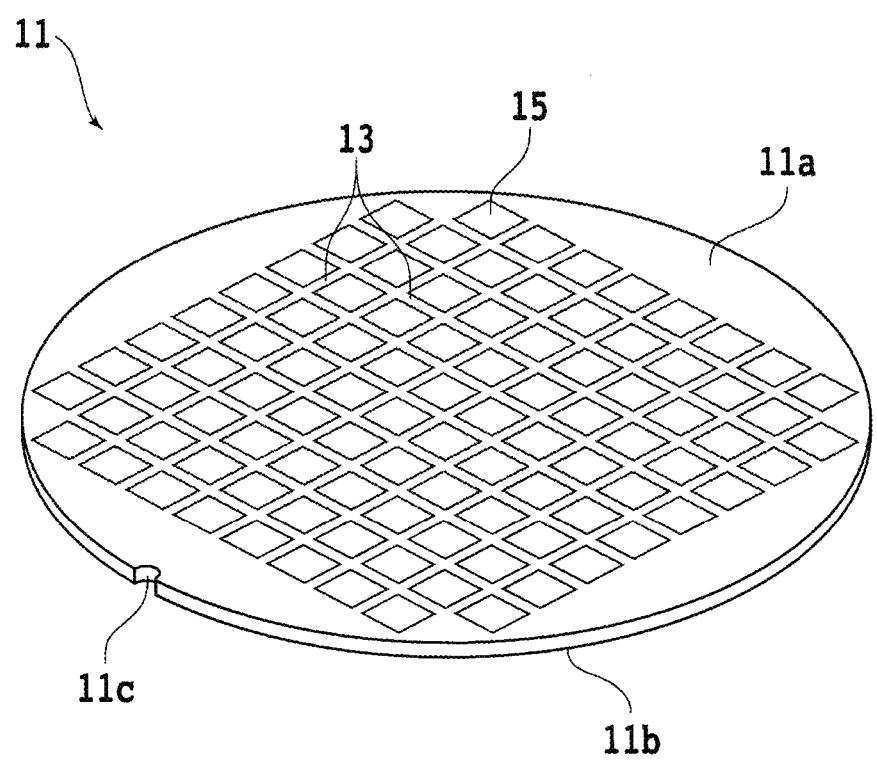
FIG. 1 is a perspective view of a wafer having a notch to be detected by a notch detecting method according to an embodiment of the present invention.

A notch detecting method according to a preferred embodiment of the present invention will be described hereinbelow with reference to the accompanying drawings. First, a wafer whose notch is to be detected by the notch detecting method according to the present embodiment will be described below. FIG. 1 illustrates the wafer, generally denoted by 11, in perspective.

The wafer 11 is a disk-shaped crystalline wafer made of a semiconductor such as silicon, for example, and includes a face side 11a and a reverse side 11b lying generally parallel to each other. The wafer 11 has a plurality of rectangular areas demarcated on the face side 11a by a grid of intersecting streets or projected dicing lines 13. Devices 15 such as integrated circuits (ICs), large-scale integration (LSI) circuits, light-emitting diodes (LEDs), or microelectromechanical systems (MEMSs) are formed respectively in the rectangular areas demarcated on the face side 11a by the streets 13.

The wafer 11 has a notch, i.e., an indentation, 11c defined in an outer circumferential portion thereof as representing the crystal orientation of the wafer 11. The notch 11c is formed when a fragment is cut off from the outer circumferential portion of the wafer 11 from an outer circumferential edge of the wafer 11 radially inwardly toward the center of the wafer 11. For example, the notch 11c is of a semicircular shape as viewed in plan. The notch 11c is formed in a predetermined position corresponding to the crystal orientation of the wafer 11. Therefore, the operator can grasp the crystal orientation of the wafer 11 by confirming the position of the notch 11c.

The wafer 11 is not limited to any particular materials, shapes, structures, sizes, etc. For example, the wafer 11 may be a disk-shaped wafer made of a semiconductor such as GaAs, InP, GaN, or Sic other than silicon, sapphire, or the like. The devices 15 are not limited to any particular kinds, quantities, shapes, structures, sizes, layouts, etc.

The wafer 11 is processed in various ways. For example, the wafer 11 may be divided along the streets 13 into a plurality of device chips having the respective devices 15. Furthermore, the wafer 11 may be thinned before being divided, so that thinned device chips may be obtained from the thinned wafer 11.

A cutting apparatus or a laser processing apparatus, for example, is used to divide the wafer 11. The cutting apparatus includes a chuck table for holding the wafer 11 thereon and a cutting unit having an annular cutting blade. When the cutting blade is rotated and moved to cut into the wafer 11 along the streets 13, the wafer 11 is cut and divided into device chips. The laser processing apparatus includes a chuck table for holding the wafer 11 thereon and a laser beam applying unit for applying a laser beam to the wafer 11. When the laser beam applying unit applies the laser beam to the wafer 11 along the streets, the wafer 11 is processed by the laser beam and divided into device chips. A grinding apparatus, for example, is used to thin the wafer 11. The grinding apparatus includes a chuck table for holding the wafer 11 thereon and a grinding unit having an annular grinding wheel that includes a plurality of grindstones. When the grinding wheel is rotated and moved to bring the grindstones into contact with the wafer 11, the wafer 11 is ground and thinned.

After the wafer 11 has been processed, the processed wafer 11 may be inspected. For example, an inspecting apparatus for observing the processed region of the wafer 11 is used to confirm the state of processing marks left on the wafer 11, e.g., kerfs, flaws, or the like.

For processing or inspecting the wafer 11, it may be necessary to place the wafer 11 in a predetermined orientation. Therefore, various processing apparatus and inspecting apparatus incorporate or are coupled to a notch detecting apparatus for detecting the notch 11c of the wafer 11. The orientation of the wafer 11 is adjusted on the basis of the position of the notch 11c detected by the notch detecting apparatus.

Figure 2:
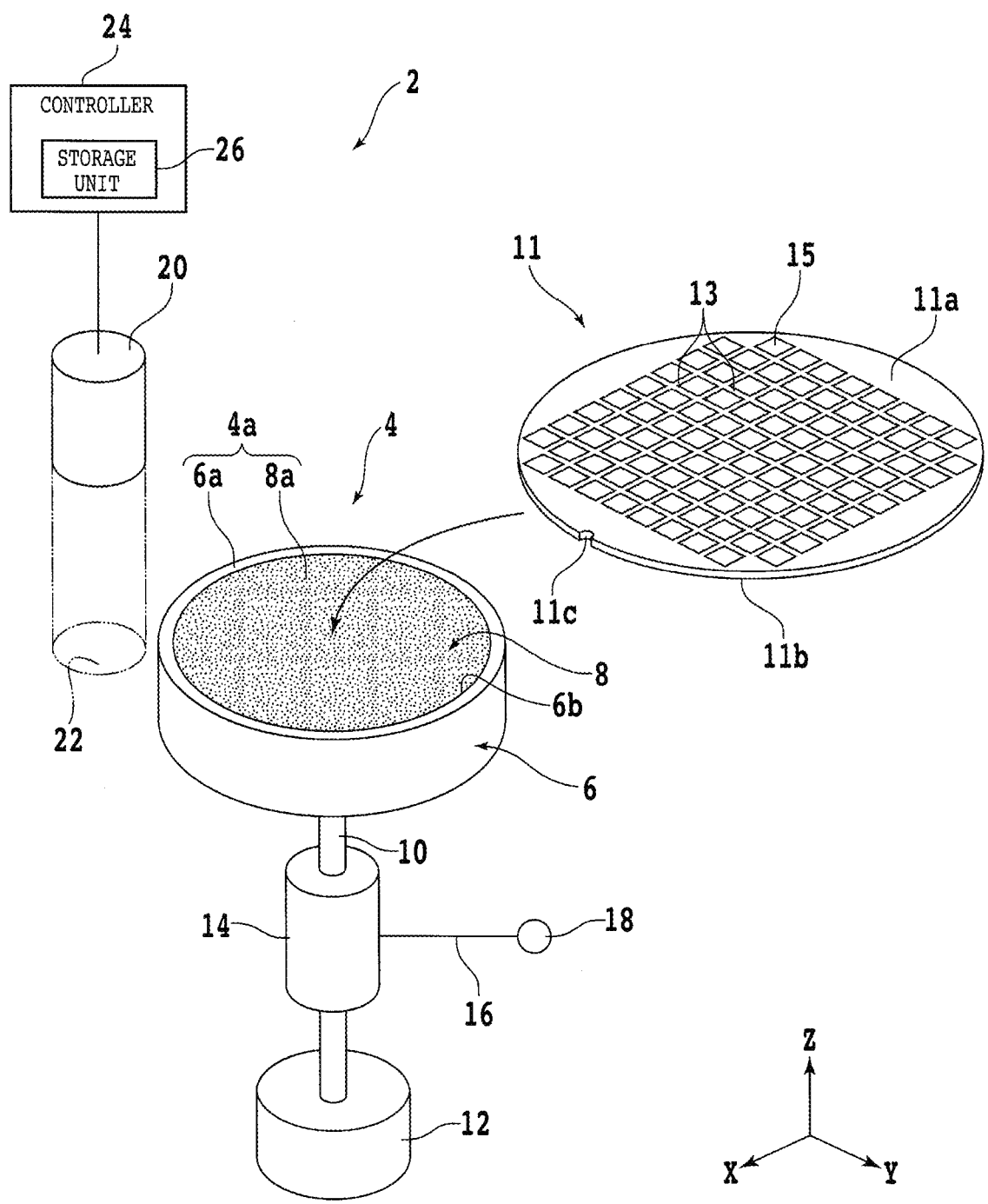
FIG. 2 is a perspective view of a notch detecting apparatus.

FIG. 2 illustrates a notch detecting apparatus, i.e., a notch detecting unit or a notch detector, 2 in perspective. In FIG. 2, X-axis directions, i.e., first horizontal directions, and Y-axis directions, i.e., second horizontal directions, extend perpendicularly to each other. Z-axis directions, i.e., vertical directions, upward and downward directions, or heightwise directions, extend perpendicularly to the X-axis directions and the Y-axis directions.

The notch detecting apparatus 2 includes a rotary table, i.e., a holding table, 4 for holding the wafer 11 thereon. The rotary table 4 has an upper surface as a flat surface generally parallel to the X-axis directions and the Y-axis directions, and acts as a holding surface 4a for holding the wafer 11 thereon.

Specifically, the rotary table 4 includes a cylindrical frame body, i.e., a main body, 6 made of metal, ceramic, resin, or the like. The frame body 6 has a hollow cylindrical cavity or groove, 6b defined centrally in an upper surface 6a thereof. A disk-shaped holding member 8 for holding the wafer 11 thereon is fitted in the cavity 6b. The holding member 8 includes a porous member made of a porous material such as porous ceramic, and includes pores, i.e., a fluid channel, therein that provides fluid communication between upper and lower surfaces of the holding member 8. The upper surface of the holding member 8 acts as a circular suction surface 8a for holding a central portion of the wafer 11 under suction thereon. The upper surface 6a of the frame body 6 and the suction surface 8a of the holding member 8 lie substantially flush with each other, jointly making up the holding surface 4a of the rotary table 4.

A tubular spindle 10 extending vertically along the Z-axis directions is connected to the rotary table 4. The spindle 10 has an upper end coupled to the lower end of the rotary table 4 and a lower end coupled to a rotary actuator 12. The rotary actuator 12 includes an electric motor for rotating the spindle 10 about a vertical axis generally parallel to the Z-axis directions. When the rotary actuator 12 applies rotary power through the spindle 10 to the rotary table 4, the rotary table 4 rotates about its central axis generally perpendicular to the holding surface 4a. The central axis about which the rotary table 4 rotates is positioned at the center of the rotary table 4.

A connector 14 is mounted on a middle portion of the spindle 10 in surrounding relation to the spindle 10. The connector 14 is connected to a suction source 18 such as an ejector through a fluid channel 16 in the form of a tube, a pipe, or the like. The holding surface 4a of the rotary table 4, i.e., the suction surface 8a of the holding member 8, is connected to the suction source 18 through the pores in the holding member 8, fluid channels, not illustrated, defined in the frame body 6 and the spindle 10, the connector 14, and the fluid channel 16.

A camera, i.e., an image capturing unit, 20 for capturing an image of the wafer 11 on the holding surface 4a is disposed over the rotary table 4. The camera 20 may include a visible light camera having an image capturing device for detecting visible light and converting it into an electric signal, an infrared camera having an image capturing device for detecting an infrared radiation and converting them into an electric signal, or the like. The camera 20 captures an image of an object that is positioned in an image capturing area 22 thereof and generates an image signal representing the captured image.

The components of the notch detecting apparatus 2, i.e., the rotary actuator 12, the suction source 18, the cameras 20, etc. are electrically connected to a controller, i.e., a control unit or a control device, 24. The controller 24 outputs control signals to the components of the notch detecting apparatus 2 to control operation of the notch detecting apparatus 2. The controller 24 includes a computer, for example, including a processing unit, not illustrated, for performing processing operations required to operate the notch detecting apparatus 2, and a storage unit 26 for storing various items of information including data, programs, etc. The processing unit includes a processor such as a central processing unit (CPU). The storage unit 26 includes various memories as a main storage device, an auxiliary storage device, etc.

The notch detecting apparatus 2 is incorporated in the various processing apparatus and the inspecting apparatus referred to above, for example. The notch detecting apparatus 2 may alternatively be installed independently of the various processing apparatus and the inspecting apparatus, and connected to the processing apparatus and the inspecting apparatus. The orientation of the wafer 11 to be processed by the processing apparatus and the orientation of the wafer 11 to be inspected by the inspecting apparatus are adjusted on the basis of the position of the notch 11c detected by the notch detecting apparatus 2.

Figure 3:
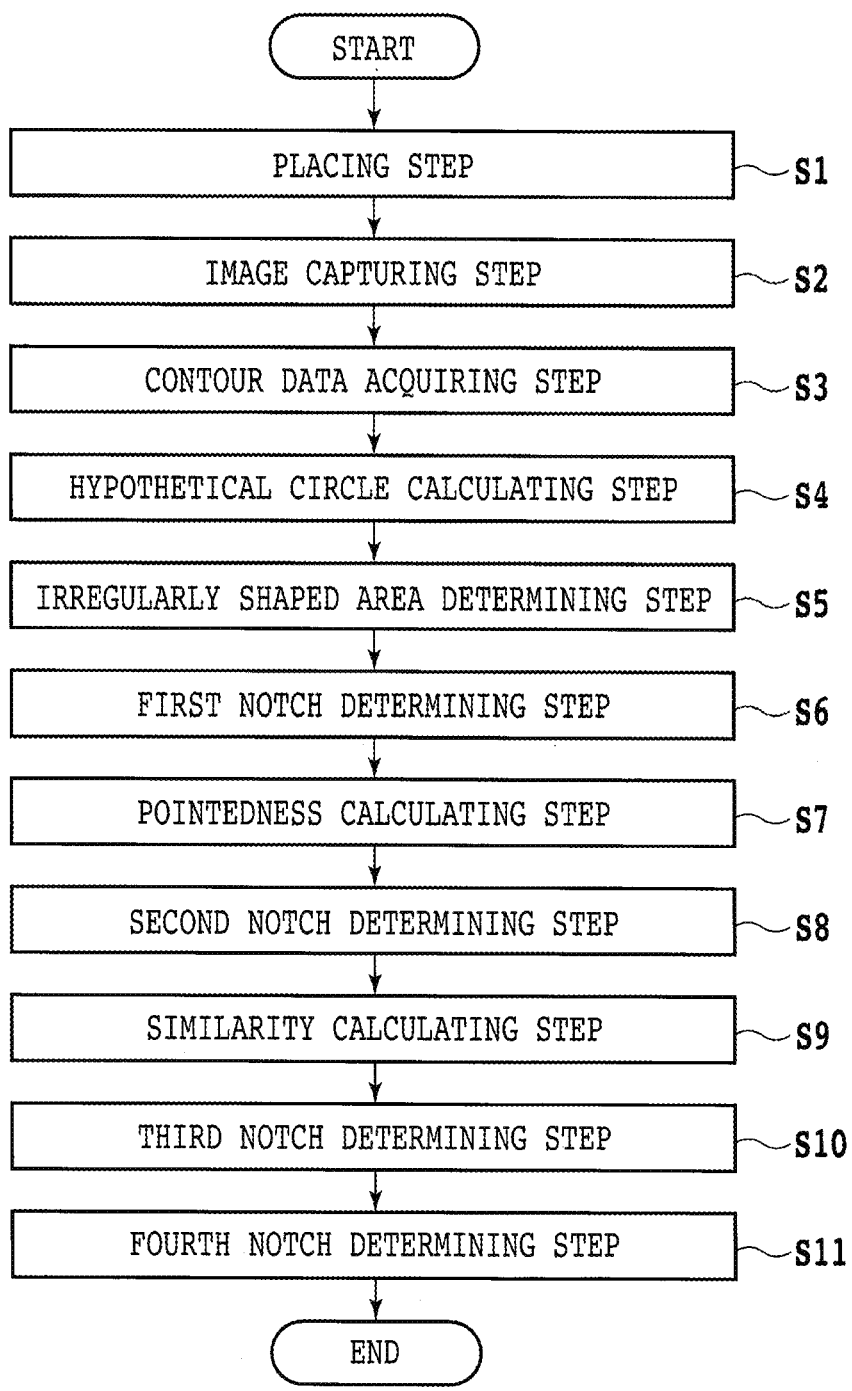
FIG. 3 is a flowchart of an operation sequence of the notch detecting apparatus.

FIG. 3 is a flowchart of an operation sequence of the notch detecting apparatus 2 for detecting the notch 11c of the wafer 11. A specific example of the notch detecting method according to the present embodiment will be described below with reference to FIGS. 2, 3, and so on.

First, a placing step (step S1) for placing the wafer 11 on the rotary table 4 will be described below. The wafer 11 is delivered to the rotary table 4 by a delivery mechanism, not illustrated. As illustrated in FIG. 2, the wafer 11 is placed on the rotary table 4 such that the face side 11a is exposed upwardly and the reverse side 11b faces the holding surface 4a, for example. Then, the suction source 18 applies a suction force, i.e., a negative pressure, to the suction surface 8a, holding the wafer 11 under suction on the rotary table 4.

The holding surface 4a of the rotary table 4 is smaller in diameter than the wafer 11. In addition, the wafer 11 is placed on the rotary table 4 such that the center of the wafer 11 and the center of the rotary table 4 are generally aligned with each other. Therefore, when the rotary table 4 holds the wafer 11 thereon, the outer circumferential portion of the wafer 11 is positioned radially outwardly of the outer circumferential edge of the holding surface 4a of the rotary table 4. In other words, the wafer 11 is placed with its outer circumferential portion protruding radially outwardly from the holding surface 4a. The camera 20 has been positionally adjusted such that the image capturing area 22 thereof is radially outwardly of the holding surface 4a of the rotary table 4. When the wafer 11 is held on the rotary table 4, a portion of the outer circumferential portion of the wafer 11 is positioned within the image capturing area 22 of the camera 20. However, the diameter of the holding surface 4a of the rotary table 4 may be identical to or larger than the diameter of the wafer 11. In this case, the holding surface 4a of the rotary table 4 can support the wafer 11 in its entirety. For example, if the wafer 11 is thin and flexible, then it is preferable to hold the wafer 11 in its entirety on the holding surface 4a of the rotary table 4.

Next, while the rotary table 4 is rotating, the camera 20 captures a plurality of images of the wafer 11, thereby performing an image capturing step (step S2) for acquiring a plurality of images of the outer circumferential portion of the wafer 11. Specifically, the controller 24 outputs a control signal to the rotary actuator 12 to rotate the rotary table 4 at a predetermined speed. Moreover, the controller 24 outputs a control signal to the camera 20 to capture a plurality of successive images of the outer circumferential portion of the wafer 11 positioned within the image capturing area 22 of the camera 20 at predetermined time intervals.

When the rotary table 4 is rotated, different areas of the outer circumferential portion of the wafer 11 are successively positioned in the image capturing area 22 of the camera 20. The camera 20 captures a succession of images of the outer circumferential portion of the wafer 11 along a circumferential direction thereof. In this manner, the camera 20 captures a plurality of images at an enlarged scale of the different areas of the outer circumferential portion of the wafer 11. The camera 20 continues to capture images of the outer circumferential portion of the wafer 11 until the wafer 11 makes one revolution upon rotation of the rotary table 4. The camera 20 captures images of the outer circumferential portion of the wafer 11 at intervals depending on the rotational speed of the rotary table 4 in order to cover the outer circumferential portion of the wafer 11 in its entirety. Therefore, when the image capturing step is carried out, one or more images including the notch 11c of the wafer 11 are acquired.

An example of images of the wafer 11 acquired in the image capturing step is illustrated in FIGS. 4A through 4E. FIGS. 4A through 4E illustrate respective images 30A through 30E captured by the camera 20 of the outer circumferential portion of the wafer 11. Each of the images 30A through 30E includes an existent region (bright region) 32 corresponding to a region where the wafer 11 exists and a non-existent region (dark region) 34 corresponding to a region where the wafer 11 does not exist. However, depending on image capturing conditions for the wafer 11, e.g., illuminating conditions, the sensitivity of the camera 20, etc., the bright and dark regions may be inverted, and the region where the wafer 11 exists may be a dark region whereas the region where the wafer 11 does not exist may be a bright region.

Figure 4A:
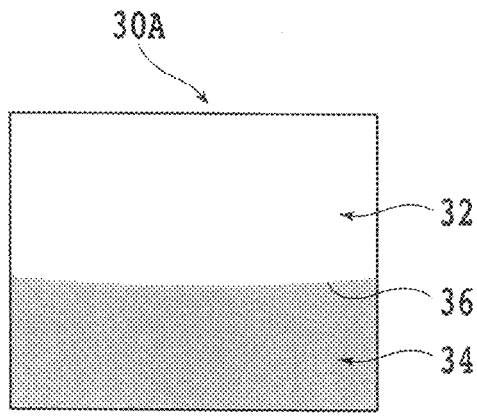
FIG. 4A is a diagram illustrating a first image of a region where no notch exists.

FIG. 4A illustrates the image 30A (first image) representing a region where the notch 11c does not exist. When an image of the wafer 11 is captured while the notch 11c is not positioned in the image capturing area 22 (see FIG. 2) of the camera 20, the image 30A is acquired which does not include a pattern corresponding to the notch 11c. The image 30A includes an arcuate contour 36 defined by the boundary line between the existent region 32 and the non-existent region 34 as representing the outer circumferential edge of the wafer 11.

Figure 4B:
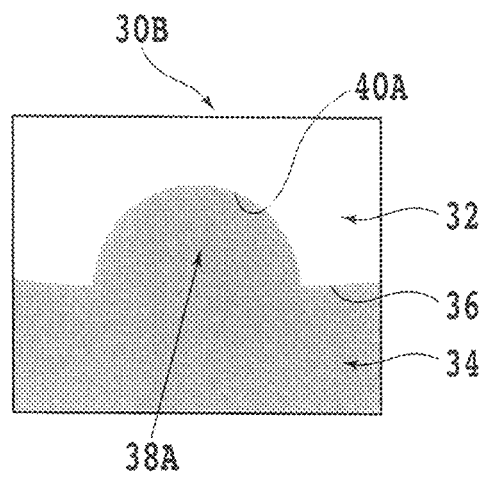
FIG. 4B is a diagram illustrating a second image of a region where a notch exists.

FIG. 4B illustrates the image 30B (second image) representing a region where the notch 11c exists. When an image of the wafer 11 is captured while the notch 11c is positioned in the image capturing area 22 (see FIG. 2) of the camera 20, the image 30B which includes an irregularly shaped area 38A corresponding to the notch 11c is acquired by the camera 20. The image 30B includes a contour 40A of the irregularly shaped area 38A that corresponds to the edge of the notch 11c, in addition to the arcuate contour 36.

The wafer 11 may have indentations other than the notch 11c in the outer circumferential portion thereof. For example, when the wafer 11 is cut along the streets 13 (see FIG. 1) by the cutting blade of the cutting apparatus, a fragment may be chipped off from the outer circumferential portion of the wafer 11 and scattered away, resulting in an indentation in the outer circumferential portion of the wafer 11. When the wafer 11 is ground by the grinding wheel of the grinding apparatus, a fragment may be broken off from the outer circumferential portion of the thinned wafer 11 by the pressure applied from the grinding wheel to the wafer 11, resulting in an indentation in the outer circumferential portion of the wafer 11. Therefore, the outer circumferential portion of the wafer 11 is liable to have unintentional indentations produced by various causes as described above. If such unintentional indentations are present in the outer circumferential portion of the wafer 11, then when the camera 20 captures successive images of the outer circumferential portion of the wafer 11, the captured images include images of those indentations other than the notch 11c. A semicircular indentation, a sectorial indentation, and a rectangular indentation that are formed in the outer circumferential portion of the wafer 11 in addition to the notch 11c will hereinafter be described by way of example.

Figure 4C:
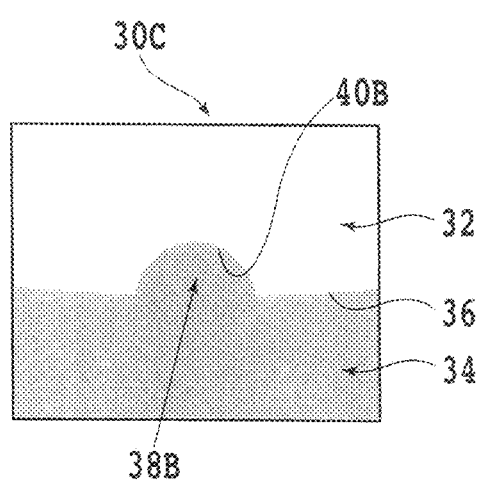
FIG. 4C is a diagram illustrating a third image of a region where a semicircular indentation exists.

FIG. 4C illustrates the image 30C (third image) representing a region where a semicircular indentation exists. In a case where the semicircular indentation exists in the outer circumferential portion of the wafer 11, the image 30C which includes an irregularly shaped area 38B corresponding to the semicircular indentation is acquired by the camera 20. The image 30C includes a contour 40B of the irregularly shaped area 38B that corresponds to the edge of the semicircular indentation, in addition to the arcuate contour 36.

Figure 4D:
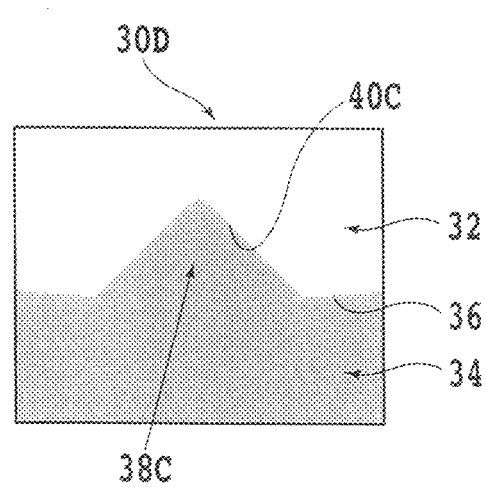
FIG. 4D is a diagram illustrating a fourth image of a region where a sectorial indentation exists.

FIG. 4D illustrates the image 30D (fourth image) representing a region where a sectorial indentation exists. In a case where the sectorial indentation exists in the outer circumferential portion of the wafer 11, the image 30D which includes an irregularly shaped area 38C corresponding to the sectorial indentation is acquired by the camera 20. The image 30D includes a contour 40C of the irregularly shaped area 38C that corresponds to the edge of the sectorial indentation, in addition to the arcuate contour 36.

Figure 4E:
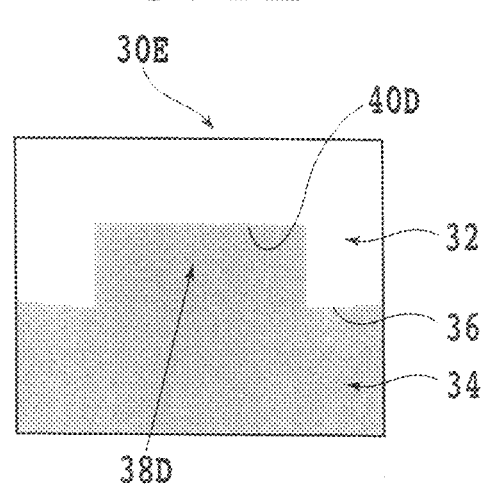
FIG. 4E is a diagram illustrating a fifth image of a region where a rectangular indentation exists.

FIG. 4E illustrates the image 30E (fifth image) representing a region where a rectangular indentation exists. In a case where the rectangular indentation exists in the outer circumferential portion of the wafer 11, the image 30E which includes an irregularly shaped area 38D corresponding to the rectangular indentation is acquired by the camera 20. The image 30E includes a contour 40D of the irregularly shaped area 38D that corresponds to the edge of the rectangular indentation, in addition to the arcuate contour 36.

When the camera 20 captures a plurality of images of the outer circumferential portion of the wafer 11, the images 30A through 30E of the outer circumferential portion of the wafer 11 are generated. The images acquired by the camera 20 are input to the controller 24 (see FIG. 2) where the images are stored in the storage unit or the memories 26. If it is clear that the notch 11c is positioned in a predetermined area at the time the wafer 11 is placed on the rotary table 4 (see FIG. 2), then the camera 20 may capture an image of that area only. In this case, since it is not necessary for the camera 20 to capture images of the entire outer circumferential portion of the wafer 11, the amount of work and time involved in carrying out the image capturing step is reduced.

Next, a contour data acquiring step (step S3) for acquiring contour data including the coordinates of the contour of the wafer 11 is carried out on the basis of the images 30A through 30E. In the contour data acquiring step, the controller 24 (see FIG. 2) performs an image processing sequence such as edge detection on each of the images 30A through 30E. The contours 36 and 40A through 40D of the images 30A through 30E are now extracted, and the coordinates of the contours 36 and 40A through 40D are specified. The coordinates of the contours 36 and 40A through 40D correspond to the coordinates of the contour, i.e., outer circumferential edge, of the wafer 11. The contour data including the coordinates of the contour of the wafer 11 are input to the controller 24 where the images are stored in the storage unit 26.

Next, a hypothetical circle calculating step (step S4) for calculating a hypothetical circle that approximates the contour of the wafer 11 is performed on the basis of the coordinates of the contour of the wafer 11. In the hypothetical circle calculating step, the contour 36 is approximated by a circle on the basis of the coordinates of the contour 36 extracted in the contour data acquiring step. The hypothetical circle calculating step is not limited to any particular approximating process, but an approximating equation for approximating the contour 36 may be derived by the least-squares method, for example. A circle represented by the approximating equation corresponds to the hypothetical circle that approximates the contour of the wafer 11.

Figure 5A:
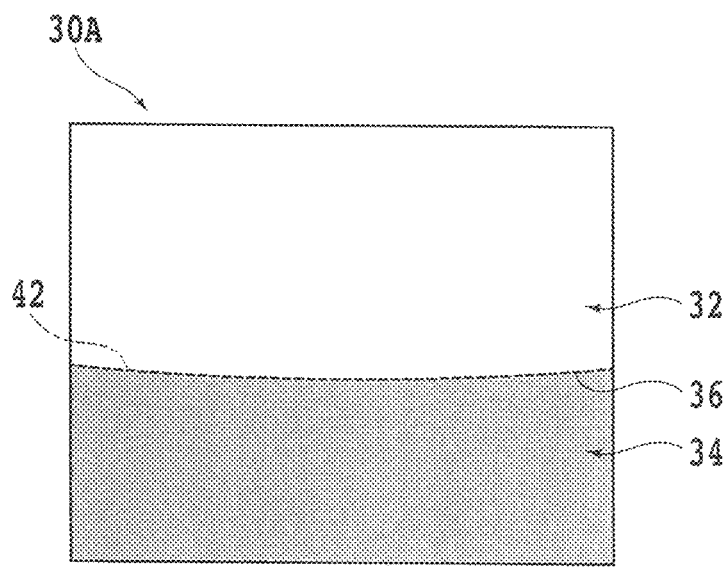
FIG. 5A is a diagram illustrating the first image where a hypothetical circle is displayed.
Figure 5B:
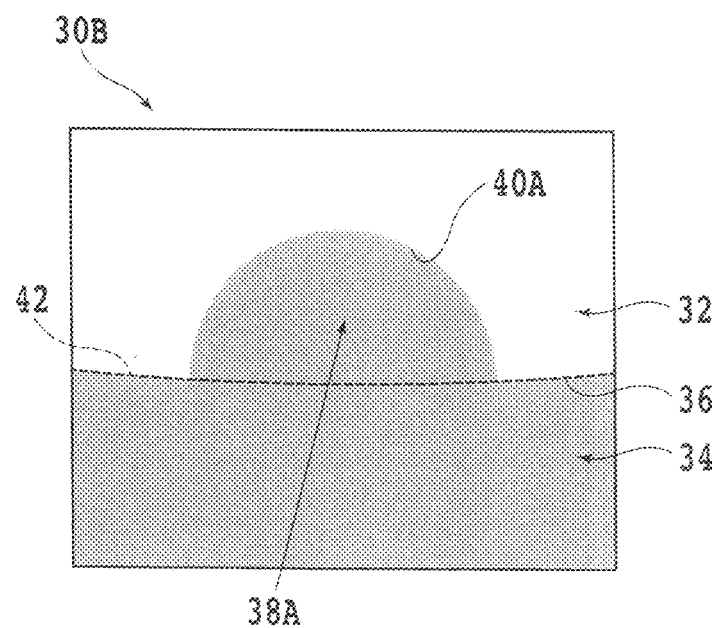
FIG. 5B is a diagram illustrating the second image where the hypothetical circle is displayed.

FIG. 5A illustrates the image 30A where a hypothetical circle 42 is displayed, and FIG. 5B illustrates the image 30B where the hypothetical circle 42 is displayed. When the images 30A and 30B and the hypothetical circle 42 are displayed in overlapping relation to each other, the hypothetical circle 42 is displayed along the contour 36. In FIGS. 5A and 5B, the hypothetical circle 42 is indicated by the broken line. The hypothetical circle 42 is calculated with respect to each of the images 30A through 30E (see FIGS. 4A through 4E). The hypothetical circle (approximating equation) calculated in the hypothetical circle calculating step is stored in the storage unit 26 of the controller 24 (see FIG. 2).

Then, an irregularly shaped area determining step (step S5) for determining whether an irregularly shaped area exists in the outer circumferential portion of the wafer 11 or not is carried out. The irregularly shaped area corresponds to an area of irregular shape in outer circumferential portion of the wafer 11 where the contour of the wafer 11 deviates from the hypothetical circle 42 by a certain distance or more.

In the irregularly shaped area determining step, the coordinates of the contour of the wafer 11, i.e., the coordinates of the contours 36 and 40A through 40D (see FIGS. 4A through 4E), and the hypothetical circle 42 are read from the storage unit 26 of the controller 24. Then, the controller 24 calculates the distance between the contour of the wafer 11 and the hypothetical circle 42 along the radial directions of the wafer 11. The distance corresponds to the deviation between the hypothetical circle 42 that approximates the contour of the wafer 11 and the actual contour of the wafer 11.

The deviation of the contour is calculated successively along the contours 36 and 40A through 40D. The controller 24 then determines whether an irregularly shaped area exists in the outer circumferential portion of the wafer 11 or not on the basis of the calculated deviations. For example, the storage unit 26 (see FIG. 2) of the controller 24 stores a preset reference value for deviations, and the controller 24 compares the calculated deviations successively with the reference value. If a deviation is equal to or larger than the reference value or is larger than the reference value, then the controller 24 determines that an irregularly shaped area exists in the outer circumferential portion of the wafer 11. If a deviation is smaller than the reference value or is equal to or smaller than the reference value, then the controller 24 determines that an irregularly shaped area does not exist in the outer circumferential portion of the wafer 11. Specifically, in the region (see FIG. 4A) of the outer circumferential portion of the wafer 11 where the notch 11c and indentations do not exist, the contour of the wafer 11 and the hypothetical circle 42 are generally in conformity with each other, with little deviation present therebetween. As a result, the controller 24 determines that an irregularly shaped area does not exist in the region. On the other hand, in the regions (see FIGS. 4B through 4E) of the outer circumferential portion of the wafer 11 where the notch 11c or an indentation exists, the contours 40A through 40D of the wafer 11 do not extend along the hypothetical circle 42, with a large deviation present therebetween. As a result, the controller 24 determines that an irregularly shaped area exists in the region.

The controller 24 is not limited to any specific determining process for determining whether an irregularly shaped area exists or not. For example, the controller 24 may automatically set a reference value to be compared with deviations of the contours of the wafer. Specifically, after having successively calculated deviations along the contours 36 and 40A through 40D, the controller 24 may set the value of an integral multiple (two times or more) of the central value of calculated deviations as a reference value. According to such a process, it is possible to set a reference value individually for each wafer 11, taking into account variations of the contour shape of the wafer 11.

Next, a first notch determining step (step S6) is carried out for determining whether an irregularly shaped area is the notch 11c or not on the basis of the distance between the hypothetical circle 42 and the tip end of the irregularly shaped area in the radial directions of the wafer 11.

In the first notch determining step, the controller (see FIG. 2) calculates a distance D between the hypothetical circle 42 and the tip end of the irregularly shaped area in the radial directions of the wafer 11. Specifically, the controller 24 calculates the distance D in each of the regions determined as the irregularly shaped regions of the outer circumferential portion of the wafer 11 in the irregularly shaped area determining step, i.e., the irregularly shaped areas 38A through 38D (see FIGS. 4B through 4E). The tip end of an irregularly shaped area corresponds to a spot at a position farthest from the hypothetical circle 42 in the radial directions of the wafer 11, on the edge (each of the contours 40A through 40D) of the irregularly shaped area.

Figure 6A:
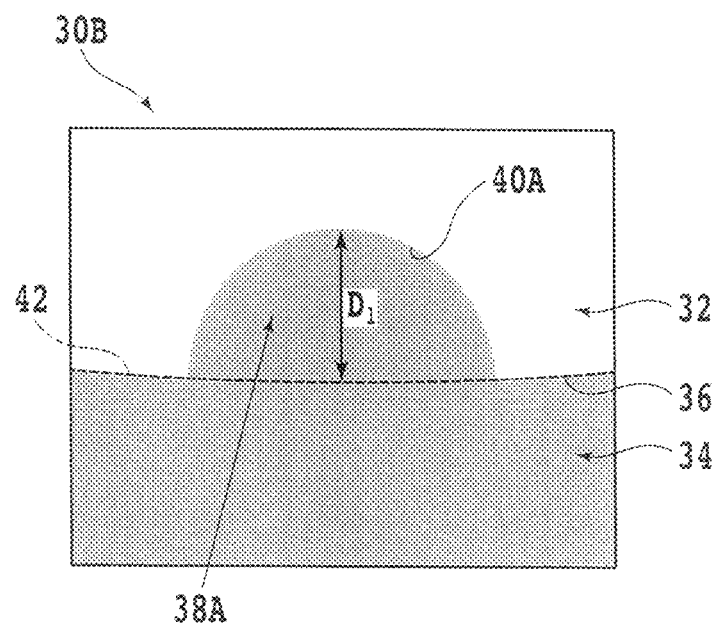
FIG. 6A is a diagram illustrating an image representing a distance $D_1$ in an irregularly shaped area in the second image.
Figure 6B:
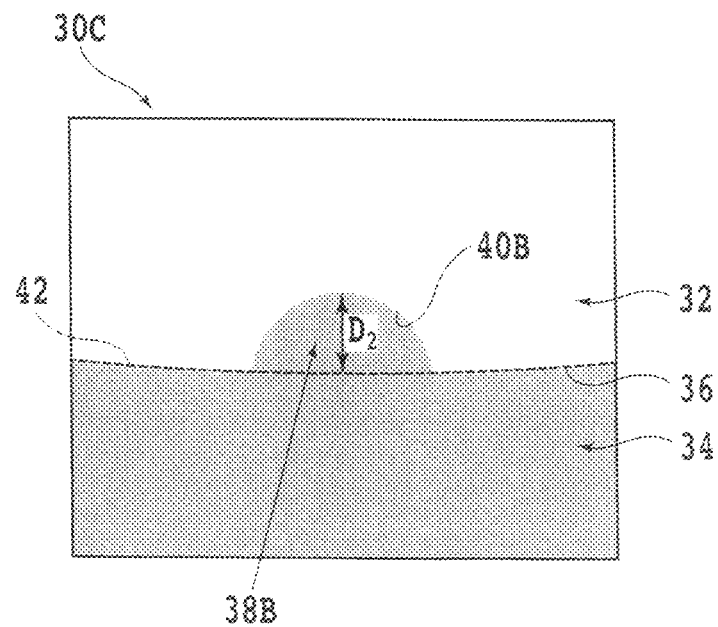
FIG. 6B is a diagram illustrating an image representing a distance $D_2$ in an irregularly shaped area in the third image.

FIG. 6A illustrates an image representing the distance D (distance $D_1$) in the irregularly shaped area 38A in the image 30B, and FIG. 6B illustrates an image representing the distance D (distance $D_2$) in the irregularly shaped area 38B in the image 30C. The tip end of the irregularly shaped area 38A corresponds to a spot on the contour 40A that is closest to the center of the wafer 11. The tip end of the irregularly shaped area 38B corresponds to a spot on the contour 40B that is closest to the center of the wafer 11.

Then, the controller 24 determines whether the irregularly shaped area is the notch 11c or not on the basis of the calculated distance D. Specifically, the storage unit 26 of the controller 24 (see FIG. 2) stores in advance a reference value for the distance D corresponding to the depth of the notch 11c (see FIG. 1). The depth of the notch 11c corresponds to the distance between the outer end of the notch 11c along the radial directions of the wafer 11 and the inner end of the notch 11c along the radial directions of the wafer 11. For example, a lower limit value of the depth of the notch 11c that can actually be formed in the wafer 11 is stored as a reference value in the storage unit 26.

The controller 24 compares the calculated distance D with the reference value to determine whether the irregularly shaped area is the notch 11c or not. Specifically, the irregularly shaped area 38A illustrated in FIG. 6A corresponds to the notch 11c, and the distance $D_1$ is equal to or larger than the lower limit value of the depth of the notch 11c. Therefore, the irregularly shaped area 38A is determined as representing the notch 11c by the controller 24. On the other hand, the irregularly shaped area 38B illustrated in FIG. 6B corresponds to an indentation smaller than the notch 11c, and the distance $D_2$ is smaller than the lower limit value of the depth of the notch 11c. Therefore, the irregularly shaped area 38B is determined as not representing the notch 11c by the controller 24.

The controller 24 is not limited to the above specific determining process for determining whether the irregularly shaped area is the notch 11c or not. For example, a range (upper and lower limit values) of the depth of the notch 11c that can actually be formed in the wafer 11 may be stored as a reference value in the storage unit 26. Furthermore, a reference value for the depth of the notch 11c can automatically be set as in the irregularly shaped area determining step referred to above. In this case, the process of presetting a reference value and storing the preset reference value in the storage unit 26 is not necessary.

As described above, the first notch determining step determines whether an irregularly shaped area formed in the outer circumferential portion of the wafer 11 is the notch 11c or not on the basis of the size of the irregularly shaped area. Therefore, an indentation that is different in size from the notch 11c is prevented from being erroneously determined as the notch 11c, and the notch 11c is properly detected.

However, if the size of an indentation formed in the outer circumferential portion of the wafer 11 is close to the size of the notch 11c, then the notch 11c may not be identified in the first notch determining step. For example, in a case where the irregularly shaped areas 38C and 38D that are equivalent in size to the notch 11c exist in the outer circumferential portion of the wafer 11, as illustrated in FIGS. 4D and 4E, the irregularly shaped areas 38C and 38D are each determined as the notch 11c, and the notch 11c is not identified.

Consequently, if there are a plurality of irregularly shaped areas determined as the notch 11c in the first notch determining step, then it is determined whether each of the irregularly shaped areas is the notch 11c or not according to another determining process. Specifically, a pointedness calculating step (step S7) for calculating the pointedness of an irregularly shaped area and a second notch determining step (step S8) for determining whether the irregularly shaped area is the notch 11c or not on the basis of the pointedness of the irregularly shaped area are carried out.

Specifically, the controller 24 performs image processing on the images (the images 30B, 30D, and 30E) of the irregularly shaped areas determined as the notch 11c in the first notch determining step for thereby converting the pointedness of each of the irregularly shaped areas into a numerical value. For example, the controller 24 performs a corner detecting process on the image of an irregularly shaped area according to a Moravec corner detecting method or the like to calculate a numerical value (corner likelihood) corresponding to the pointedness of the tip end of the irregularly shaped area.

Next, the controller 24 determines whether the irregularly shaped area is the notch 11c or not on the basis of the pointedness of the irregularly shaped area. Specifically, a reference value for corner likelihood is stored in advance in the storage unit 26 (see FIG. 2) of the controller 24. For example, an upper limit value for the corner likelihood of the notch 11c that can actually be formed in the wafer 11 is stored as a reference value in the storage unit 26. Then, the controller 24 compares the calculated corner likelihood with the reference value for thereby determining whether the irregularly shaped area is the notch 11c or not.

Figure 7A:
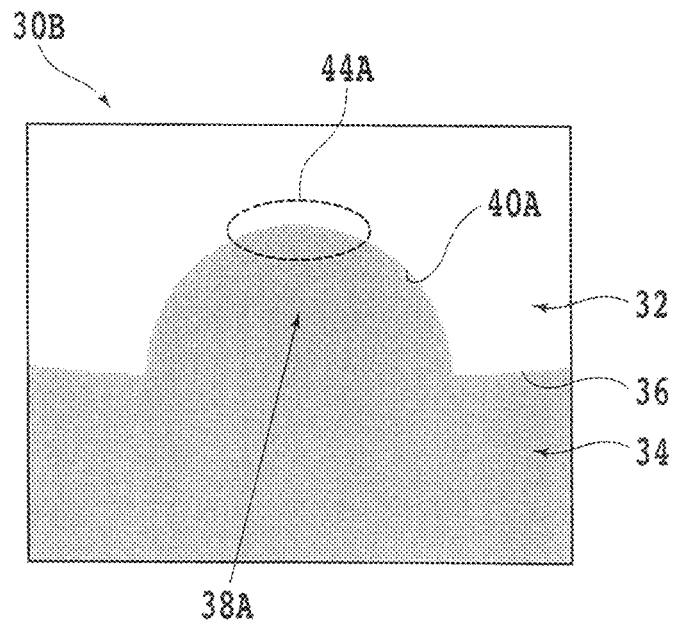
FIG. 7A is a diagram illustrating an image representing a tip end portion of the irregularly shaped area in the second image.
Figure 7B:
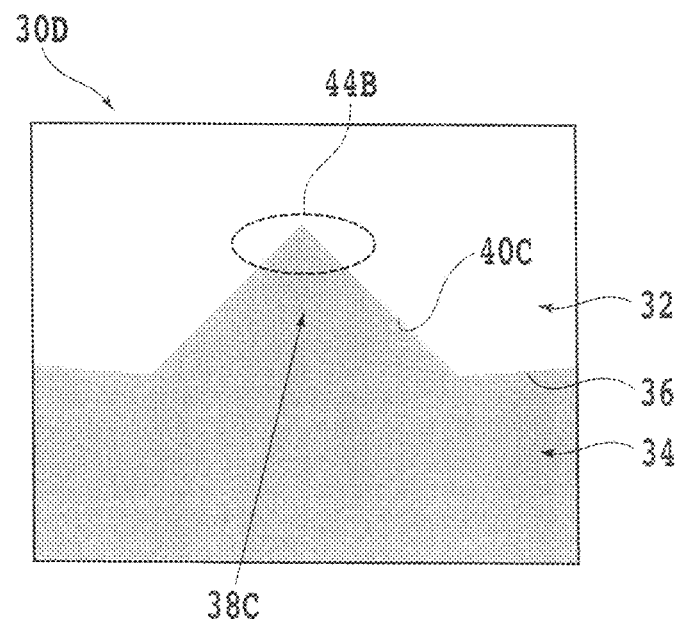
FIG. 7B is a diagram illustrating an image representing a tip end portion of the irregularly shaped area in the fourth image.

FIG. 7A illustrates an image representing a tip end portion 44A of the irregularly shaped area 38A in the image 30B, and FIG. 7B illustrates an image representing a tip end portion 44B of the irregularly shaped area 38C in the image 30D. As illustrated in FIGS. 7A and 7B, the tip end portion 44A of the irregularly shaped area 38A does not include a corner, and the tip end portion 44B of the irregularly shaped area 38C includes a corner. Therefore, the irregularly shaped area 38A and the irregularly shaped area 38C have different degrees of corner likelihood.

The irregularly shaped area 38A illustrated in FIG. 7A corresponds to the notch 11c, and the corner likelihood of the irregularly shaped area 38A is equal to or smaller than the upper limit value of the corner likelihood of the notch 11c. Consequently, the irregularly shaped area 38A is determined as the notch 11c by the controller 24. On the other hand, the irregularly shaped area 38C illustrated in FIG. 7B corresponds to an indentation sharper than the notch 11c, and the corner likelihood of the irregularly shaped area 38C is larger than the upper limit value of the corner likelihood of the notch 11c. Consequently, the irregularly shaped area 38C is determined as not the notch 11c by the controller 24.

The notch 11c is not limited to any specific determining process. For example, a range (upper and lower limit values) of the corner likelihood of the notch 11c that can actually be formed in the wafer 11 may be stored as a reference value in the storage unit 26. Furthermore, a reference value for the corner likelihood can automatically be set. For example, after having successively calculated degrees of corner likelihood of areas included as irregularly shaped areas, the controller 24 may set the value of an integral multiple (two times or more) of the central value of calculated degrees of corner likelihood as a reference value for the corner likelihood.

As described above, the second notch determining step determines whether an irregularly shaped area formed in the outer circumferential portion of the wafer 11 is the notch 11c or not on the basis of the pointedness of the irregularly shaped area. Therefore, an indentation that is different in pointedness from the notch 11c is prevented from being erroneously determined as the notch 11c, and the notch 11c is properly detected.

However, if the tip end portion of an indentation formed in the outer circumferential portion of the wafer 11 does not include a corner, then the notch 11c may not be identified in the second notch determining step. For example, the tip end of the irregularly shaped area 38D illustrated in FIG. 4E is flat and does not include a sharp corner. Therefore, the irregularly shaped area 38D tends to be determined as the notch 11c, and the notch 11c is less likely to be identified.

Consequently, if there are a plurality of irregularly shaped areas determined as the notch 11c in the second notch determining step, then it is determined whether each of the irregularly shaped areas is the notch 11c or not according to another determining process. Specifically, a similarity calculating step (step S9) for calculating the similarity between a first image and a second image that are obtained by dividing an image including an irregularly shaped area, a third notch determining step (step S10) for determining whether the irregularly shaped area is the notch 11c or not on the basis of the similarity between the first image and an inverted image of the second image, i.e., an image produced by inverting the second image, and a fourth notch determining step (step S11) for determining whether the irregularly shaped area is the notch 11c or not on the basis of the similarity between the first image and the second image are carried out.

In the similarity calculating step, an image including an irregularly shaped area is divided into a first image and a second image by a straight line that extends radially of the wafer 11 to divide the irregularly shaped area into two parts (dividing step). The division of each of the images 30B and 30E into a first image and a second image will be described hereinafter in detail.

Figure 8A:
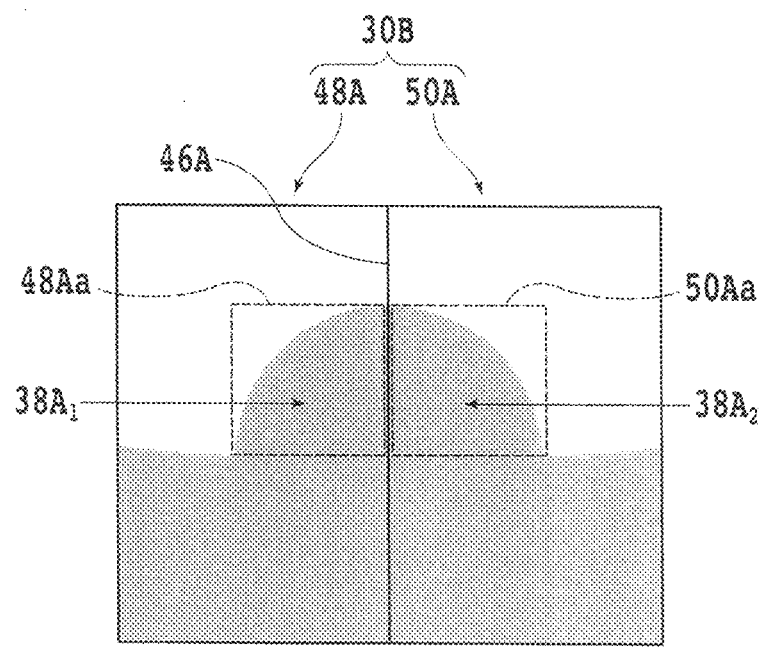
FIG. 8A is a diagram illustrating an image representing the second image that is divided by a dividing line.

FIG. 8A illustrates the image 30B that has been divided into a first image 48A and a second image 50A by a dividing line 46A. The image 30B is divided into the first image 48A and the second image 50A by the dividing line 46A as a straight line that extends radially of the wafer 11 to divide the irregularly shaped area 38A into two equal parts. As a result, the first image 48A includes an area 48Aa including an irregularly shaped area $38A_1$ corresponding to a portion of the divided irregularly shaped area 38A. Moreover, the second image 50A includes an area 50Aa including an irregularly shaped area $38A_2$ corresponding to a portion of the divided irregularly shaped area 38A.

Figure 8B:
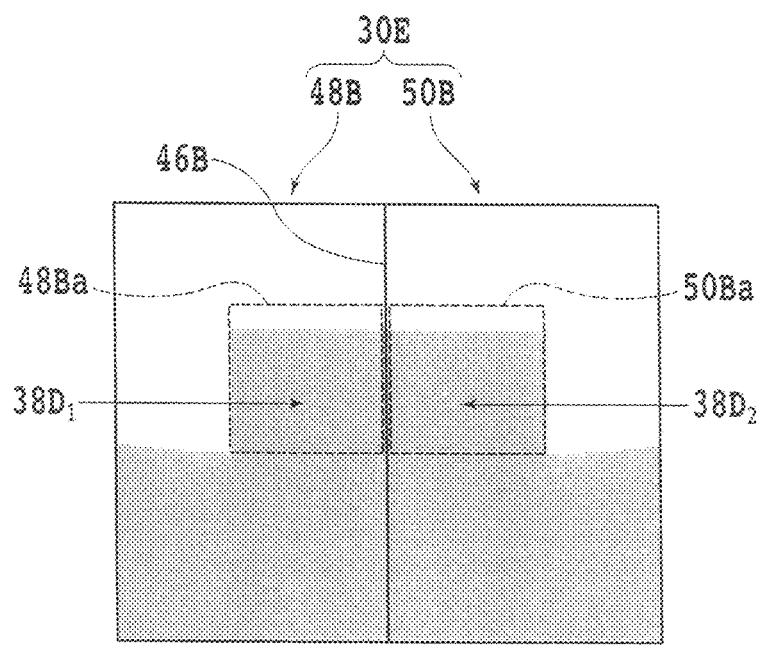
FIG. 8B is a diagram illustrating an image representing the fifth image that is divided by a dividing line.

FIG. 8B illustrates the image 30E that has been divided into a first image 48B and a second image 50B by a dividing line 46B. The image 30E is divided into the first image 48B and the second image 50B by the dividing line 46B as a straight line that extends radially of the wafer 11 to divide the irregularly shaped area 38D into two equal parts. As a result, the first image 48B includes an area 48Ba including an irregularly shaped area $38D_1$ corresponding to a portion of the divided irregularly shaped area 38D. Moreover, the second image 50B includes an area 50Ba including an irregularly shaped area $38D_2$ corresponding to a portion of the divided irregularly shaped area 38D.

There is no limitation on how to specify a straight line, i.e., a dividing line, that divides an irregularly shaped area into two parts. For example, one of a plurality of straight lines, i.e., candidate lines, interconnecting the hypothetical circle 42 (see FIG. 5B, etc.) and an edge of the irregularly shaped area radially of the wafer 11 may be selected as a dividing line.

Specifically, of a plurality of candidate lines, the candidate line whose length is largest or the candidate line whose moving average value of length is largest is selected as a dividing line. Alternatively, of a plurality of candidate lines, the candidate line that passes through the midpoint between both ends of the irregularly shaped area, i.e., between a point where an end of the irregularly shaped area and the hypothetical circle 42 are joined to each other and a point where another end of the irregularly shaped area and the hypothetical circle 42 are joined to each other, may be selected as a dividing line.

Furthermore, a dividing line may be established on the basis of the positions and lengths of candidate lines. Specifically, first, a plurality of points on the hypothetical circle 42 that are included in an area adjacent to the irregularly shaped area are established as reference points. Next, the product xL of the positional coordinates x representing the position of a reference point and the length L of the candidate line passing through the reference point is calculated for each of the reference points. Then, the sum of the values xL of the respective reference points is divided by the sum of the lengths L of the candidate lines. In this manner, the positional coordinates x' of a reference point weighed by the length of the candidate line are calculated. The candidate line passing through the reference point specified by the positional coordinates x' is now established as a dividing line. The position of a reference point may be represented by an angle θ based on the hypothetical circle 42, rather than the positional coordinates x. In this case, an angle θ' of a reference point weighed by the length of the candidate line is calculated. The candidate line passing through the reference point specified by the angle θ' is established as a dividing line.

Next, the second image 50A of the image 30B and the second image 50B of the image 30E are inverted. Specifically, the controller 24 performs an image processing sequence on the image 30B to invert the second image 50A about the dividing line 46A. Likewise, the controller 24 performs an image processing sequence on the image 30E to invert the second image 50B about the dividing line 46B. In this fashion, an inverted image of the second image 50A and an inverted image of the second image 50B are generated.

Figure 9A:
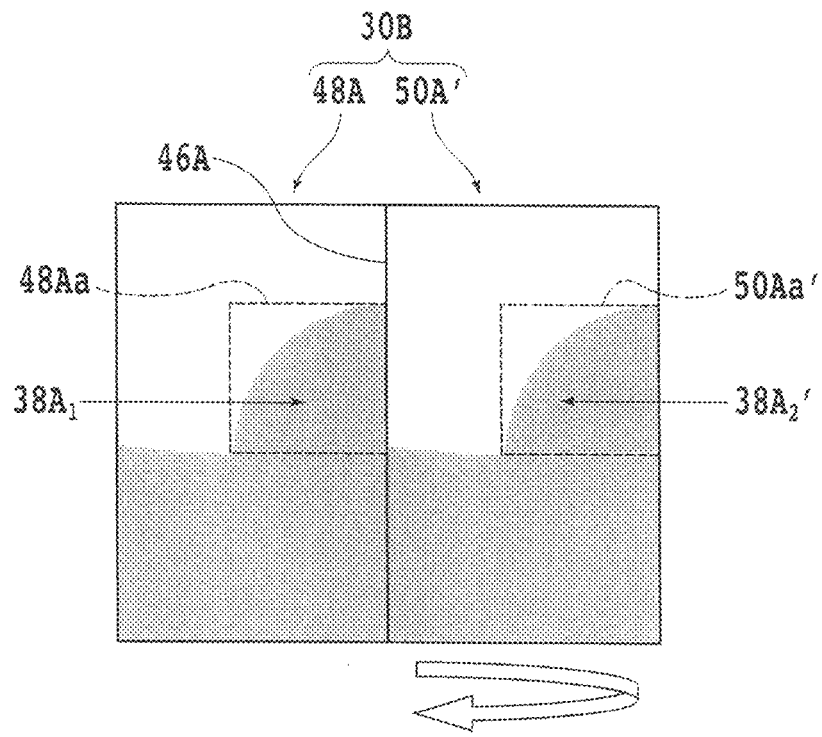
FIG. 9A is a diagram illustrating an image representing the second image that includes an inverted image.
Figure 9B:
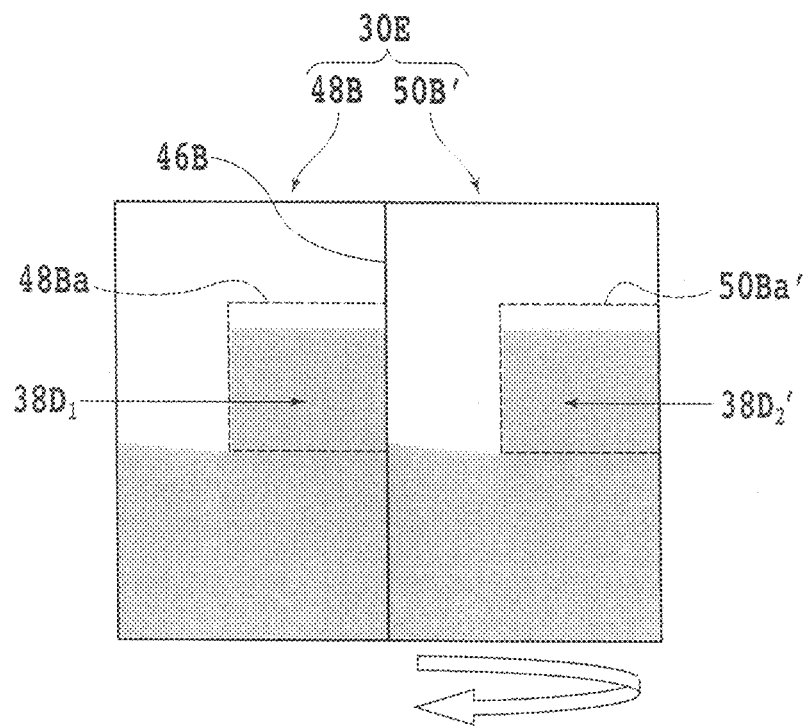
FIG. 9B is a diagram illustrating an image representing the fifth image that includes an inverted image.

FIG. 9A illustrates the image 30B that includes the first image 48A and the inverted image, denoted by 50A', of the second image 50A. FIG. 9B illustrates the image 30E that includes the first image 48B and the inverted image, denoted by 50B', of the second image 50B. The inverted image 50A' includes an area 50Aa' including an irregularly shaped area $38A_2'$ corresponding to the irregularly shaped area $38A_2$ (see FIG. 8A) prior to being inverted. The inverted image 50B' includes an area 50Ba' including an irregularly shaped area $38D_2'$ corresponding to the irregularly shaped area $38D_2$ (see FIG. 8B) prior to being inverted.

Next, the controller 24 calculates a first similarity corresponding to the similarity between the first image and the inverted image of the second image (first similarity calculating step). Specifically, first, the controller 24 compares the first image 48A and the inverted image 50A' of the image 30B with each other according to an image processing sequence and converts the similarity between the first image 48A and the inverted image 50A' into a numerical value. There is no limitation on the details of the image processing sequence for comparing the first image 48A and the inverted image 50A' with each other. For example, the similarity between the area 48Aa included in the first image 48A and the area 50Aa' included in the inverted image 50A' is converted into a numerical value according to a similarity calculating method that is used for template matching or the like. A specific similarity calculating method may freely be selected from, for example, sum of squared difference (SSD), sum of absolute difference (SAD), normalized cross correlation (NCC), etc. Similarly, the controller 24 compares the first image 48B and the inverted image 50B' of the image 30E with each other according to an image processing sequence and converts the similarity therebetween into a numerical value. As a result, the numerical value representing the similarity between the first image 48A and the inverted image 50A' that are included in the image 30B, and the numerical value representing the similarity between the first image 48B and the inverted image 50B' that are included in the image 30E are obtained. The numerical values representing the similarities correspond to the first similarity.

Next, the controller 24 calculates a second similarity corresponding to the similarity between the first image and the second image (second similarity calculating step). Specifically, the controller 24 compares the first image 48A and the second image 50A (see FIG. 8A) of the image 30B with each other according to an image processing sequence and converts the similarity between the first image 48A and the second image 50A into a numerical value. Similarly, the controller 24 compares the first image 48B and the second image 50B (see FIG. 8B) of the image 30E with each other according to an image processing sequence and converts the similarity therebetween into a numerical value. As a result, the numerical value representing the similarity between the first image 48A and the second image 50A that are included in the image 30B, and the numerical value representing the similarity between the first image 48B and the second image 50B that are included in the image 30E are obtained. The numerical values representing the similarities correspond to the second similarity. There is no limitation on the process for comparing the first image and the second image with each other. A similarity may be calculated according to a process similar to the process in the first similarity calculating step. Specifically, in the image 30B, the similarity between the area 48Aa included in the first image 48A and the area 50Aa included in the second image 50A is converted into a numerical value. Moreover, in the image 30D, the similarity between the area 48Ba included in the first image 48B and the area 50Ba included in the second image 50B is converted into a numerical value.

Next, the controller 24 determines whether the irregularly shaped area is the notch 11c or not on the basis of the first similarity (third notch determining step). For example, the storage unit 26 of the controller 24 stores in advance a preset reference value for the first similarity, and the controller 24 compares the first similarity with the reference value. Then, the controller 24 determines whether the irregularly shaped area is the notch 11c or not on the basis of the relationship between the magnitudes of the first similarity and the reference value. Specifically, if the similarity between the first image and the inserted image is equal to or larger than the reference value or is larger than the reference value, the controller 24 determines that the irregularly shaped area is the notch 11c.

As illustrated in FIG. 9A, the first image 48A includes the area 48Aa representing an arcuate pattern (the irregularly shaped area 38A$_1$), and the inverted image 50A' includes the area 50Aa' representing an arcuate pattern (the irregularly shaped area 38A$_2$'). Those arcuate patterns are generally in conformity with each other and are similar to each other. Therefore, the first image 48A and the inverted image 50A' include patterns that are similar to each other, and the similarity between the first image 48A and the inverted image 50A' is high.

Moreover, as illustrated in FIG. 9B, the first image 48B includes the area 48Ba representing a rectangular pattern (the irregularly shaped area 38D$_1$), and the inverted image 50B' includes the area 50Ba' representing a rectangular pattern (the irregularly shaped area 38D$_2$'). Those rectangular patterns are generally in conformity with each other and are similar to each other. Therefore, the first image 48B and the inverted image 50B' include patterns that are similar to each other, and the similarity between the first image 48B and the inverted image 50B' is high.

Therefore, both the similarity between the first image 48A and the inverted image 50A' and the similarity between the first image 48B and the inverted image 50B' are larger than the reference value. As a result, the irregularly shaped area 38A included in the image 30B and the irregularly shaped area 38D included in the image 30E are each determined as the notch 11c.

Furthermore, the controller 24 determines whether the irregularly shaped area is the notch 11c or not on the basis of the second similarity (the fourth notch determining step). For example, the storage unit 26 of the controller 24 stores in advance a preset reference value for the second similarity, and the controller 24 compares the second similarity with the reference value. Then, the controller 24 determines whether the irregularly shaped area is the notch 11c or not on the basis of the relationship between the magnitudes of the second similarity and the reference value. Specifically, if the similarity between the first image and the second image is equal to or smaller than the reference value or is smaller than the reference value, the controller 24 determines that the irregularly shaped area is the notch 11c.

As illustrated in FIG. 8A, the first image 48A includes the area 48Aa representing an arcuate pattern (the irregularly shaped area 38A$_1$), and the second image 50A includes the area 50Aa representing an arcuate pattern (the irregularly shaped area 38A$_2$). However, those arcuate patterns are angularly different from each other by approximately 90°, and are not similar to each other. Therefore, the first image 48A and the second image 50A do not include patterns that are similar to each other, and the similarity between the first image 48A and the second image 50A is low. On the other hand, as illustrated in FIG. 8B, the first image 48B includes the area 48Ba representing a rectangular pattern (the irregularly shaped area 38D$_1$), and the second image 50B includes the area 50Ba representing a rectangular pattern (the irregularly shaped area 38D$_2$). Those rectangular patterns are generally in conformity with each other, and are similar to each other. Therefore, the first image 48B and the second image 50B include patterns that are similar to each other, and the similarity between the first image 48B and the second image 50B is high. Consequently, the similarity between the first image 48A and the second image 50A is lower than the reference value. As a result, the irregularly shaped area 38A included in the image 30B is determined as the notch 11c. On the other hand, the similarity between the first image 48B and the second image 50B is higher than the reference value. As a result, the irregularly shaped area 38D included in the image 30E is determined as not the notch 11c.

As described above, an irregularly shaped area that is of bilateral symmetry is excluded from the candidates for the notch 11c by the third notch determining step, and an irregularly shaped area that is rectangular is excluded from the candidates for the notch 11c by the fourth notch determining step. According to the present embodiment, since the irregularly shaped area 38D included in the image 30E, for example, is of bilateral symmetry, the irregularly shaped area 38D is not excluded from the candidates for the notch 11c by the third notch determining step, but is excluded from the candidates for the notch 11c by the fourth notch determining step. As a consequence, it is found that the irregularly shaped area 38A (see FIG. 4B) included in the image 30B represents the notch 11c, and the irregularly shaped areas 38B through 38D (see FIGS. 4C through 4E) included in the images 30C through 30E represent indentations other than the notch 11c.

As described above, the notch detecting method according to the present embodiment determines whether an irregularly shaped area formed in the outer circumferential portion of the wafer 11 is the notch 11c or not on the basis of the size or shape of the irregularly shaped area. Accordingly, even if an indentation other than the notch 11c is formed in the outer circumferential portion of the wafer 11, the indentation is less likely to be erroneously determined as the notch 11c, and the notch 11c can properly be detected.

The notch detecting method described above is automatically carried out by the controller 24 (see FIG. 2). Specifically, the storage unit 26 of the controller 24 stores a program descriptive of a sequence of operation (see steps S2 through S11 in FIG. 3) for detecting the notch 11c. When the wafer 11 is placed on the rotary table 4 (step S1), the controller 24 reads the program from the storage unit 26 and executes the program to detect the notch 11c. Thus, the notch 11c can be detected easily and quickly.

According to the present embodiment, the four notch detecting steps, i.e., the first through fourth notch detecting steps, are successively carried out. However, the number of notch detecting steps may be varied appropriately. Specifically, of the first through fourth notch detecting steps, any one, two, or three notch detecting steps may be carried out. Furthermore, in a case where a plurality of notch detecting steps are carried out, the notch detecting steps may be carried out in a freely established order.

Structural details, operational details, and other details of the present embodiment may be changed or modified appropriately without departing from the scope of the invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A notch detecting method for detecting a notch defined in an outer circumferential portion of a disk-shaped wafer as representing a crystal orientation of the wafer, comprising:
   a placing step of placing the wafer on a rotary table and positioning a portion of the outer circumferential portion of the wafer in an image capturing area of a camera;
   an image capturing step of capturing a plurality of images of the wafer with the camera while the rotary table is rotating, thereby acquiring an image of the outer circumferential portion of the wafer;
   a contour data acquiring step of acquiring contour data including coordinates of a contour of the wafer on a basis of the acquired image;
   a hypothetical circle calculating step of calculating a hypothetical circle that approximates the contour of the wafer, on a basis of the coordinates of the contour of the wafer;
   an irregularly shaped area determining step of determining whether an irregularly shaped area exists in the outer circumferential portion of the wafer or not on a basis of a distance between the hypothetical circle and the contour of the wafer along radial directions of the wafer; and
   a first notch determining step of determining whether the irregularly shaped area is a notch or not on a basis of a distance between the hypothetical circle and a tip end of the irregularly shaped area along the radial directions of the wafer.

2. The notch detecting method according to claim 1, further comprising:
   a pointedness calculating step for calculating pointedness of the irregularly shaped area; and
   a second notch determining step of determining whether the irregularly shaped area is a notch or not on a basis of the pointedness of the irregularly shaped area.

3. The notch detecting method according to claim 2, further comprising:
   a dividing step of dividing the image into a first image and a second image by a straight line that extends radially of the wafer to divide the irregularly shaped area into two parts;
   a first similarity calculating step of calculating a first similarity corresponding to a similarity between the first image and an inverted image produced by inverting the second image about the straight line;
   a second similarity calculating step of calculating a second similarity corresponding to a similarity between the first image and the second image;
   a third notch determining step of determining whether the irregularly shaped area is a notch or not on a basis of the first similarity; and
   a fourth notch determining step of determining whether the irregularly shaped area is a notch or not on a basis of the second similarity.

* * * * *